United States Patent
Carey et al.

(10) Patent No.: US 6,928,723 B2
(45) Date of Patent: Aug. 16, 2005

(54) METHOD FOR MAKING A MAGNETORESISTIVE SENSOR HAVING A COBALT-FERRITE PINNING LAYER

(75) Inventors: Matthew Joseph Carey, San Jose, CA (US); Hoa Van Do, Fremont, CA (US); Robin Frederick Charles Farrow, San Jose, CA (US); Bruce Alvin Gurney, San Rafael, CA (US); David Thomas Margulies, Gilroy, CA (US); Ronald Franklin Marks, San Jose, CA (US); Philip Milton Rice, San Jose, CA (US); Ren Xu, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 10/746,021

(22) Filed: Dec. 23, 2003

(65) Prior Publication Data

US 2004/0134060 A1 Jul. 15, 2004

Related U.S. Application Data

(62) Division of application No. 09/755,556, filed on Jan. 4, 2001, now Pat. No. 6,721,144.

(51) Int. Cl.[7] ........................ G11B 5/127; H04R 31/00
(52) U.S. Cl. ................... 29/603.07; 29/603.11; 29/603.13; 29/603.14; 29/603.15; 29/605; 360/324; 360/325; 360/326; 360/327; 427/127; 427/128; 204/192.15
(58) Field of Search ............... 29/603.07, 603.11, 29/603.13–603.17, 605; 360/324–327; 427/127, 128; 216/192.15

(56) References Cited

U.S. PATENT DOCUMENTS

| | | | |
|---|---|---|---|
| 5,665,465 A | | 9/1997 | Gyorgy et al. ............... 428/328 |
| 6,411,476 B1 | * | 6/2002 | Lin et al. ............... 360/324.11 |
| 6,542,341 B1 | * | 4/2003 | Carey et al. ................. 360/324 |
| 6,738,236 B1 | * | 5/2004 | Mao et al. ............. 360/324.11 |

FOREIGN PATENT DOCUMENTS

JP 10177706 A * 6/1998 ............ G11B/5/39

OTHER PUBLICATIONS

"Properties of magnetic fluid particles"; Berkowitz, A.; Lahut, J.; VanBuren C.; Magnetics, IEEE Transactions on, vol.: 16, Issue: 2, Mar. 1980; pp.:184–190.*

R. F. C. Farrow, M. J. Carey, R. F. Marks, and P. M. Rice; "Enhanced blocking temperature in NIO spin valve s: role of cubic spinel ferrite layer between pinned layer and NIO;" Applied Physics Letters, vol. 77, No. 8, Aug. 21, 2000.

P. C. Dorsey, P. Lubitz, D. B. Chrisey, and J. S. Horwitz; "$CoFe_2O_4$ thin films grown on (100) MgO substrates using pulsed laser deposition;" J. Appl. Phys. 79 (8), Apr. 15, 1996.

Y. Suzuki, R. B. van Dover, E. M. Gyorgy, Julia m. Phillips, V. Korenivski, D. J. Werder, C. H. Chen, R. J. Cava, J. J. Krajewski, and W. F. Peck, Jr.; "Structure and magnetic properties of epitaxial spinel ferrite thin films;" Appl. Phys. Lett. 68 (5), Jan. 29, 1996.

* cited by examiner

Primary Examiner—Paul D Kim
(74) Attorney, Agent, or Firm—Lumen Intellectual Property Services, Inc.

(57) ABSTRACT

An exchange-coupled magnetic structure of a cobalt-ferrite layer adjacent a magnetic metal layer is used in magnetoresistive sensors, such as spin valves or tunnel junction valves. The exchange-coupled magnetic structure is used in a pinning structure pinning the magnetization of a ferromagnetic pinned layer, or in an AP pinned layer. A low coercivity ferrite may be used in an AP free layer. Cobalt-ferrite layers may be formed by co-sputtering of Co and Fe in an oxygen/argon gas mixture, or by sputtering of a $CoFe_2$ composition target in an oxygen/argon gas mixture. Alternatively, the cobalt-ferrite layer may be formed by evaporation of Co and Fe from an alloy source or separate sources along with a flux of oxygen atoms from a RF oxygen atom beam source. Magnetoresistive sensors including cobalt-ferrite layers have small read gaps and produce large signals with high efficiency.

13 Claims, 15 Drawing Sheets

METHOD FOR MAKING A MAGNETORESISTIVE SENSOR HAVING A COBALT-FERRITE PINNING LAYER

RELATED APPLICATIONS

This application is a Divisional or a claims priority under 35 U.S.C. 121 to application Ser. No. 09/755,556 filed on Jan. 4, 2001 now U.S. Pat. No. 6,721,144 titled "Spin Valves With Co-Ferrite Pinning Layer."

FIELD OF THE INVENTION

This invention relates generally to spin valves and tunnel valves used as magnetic field sensors. More particularly, it relates to spin valves with an improved magnetic pinning layer.

BACKGROUND ART

Conventional magnetoresistive (MR) sensors, such as those used in magnetic recording disk drives, operate on the basis of the anisotropic magnetoresistive (AMR) effect in which a component of the read element resistance varies as the square of the cosine of the angle between the magnetization in the read element and the direction of sense current flow through the read element. Recorded data can be read from a magnetic medium because the external magnetic field from the recorded magnetic medium (the signal field) causes a change in the direction of magnetization in the read element, which in turn causes a change in resistance in the read element and a corresponding change in the sensed current or voltage.

A different and more pronounced magnetoresistance, called giant magnetoresistance (GMR), has been observed in a variety of magnetic multilayered structures, the essential feature being at least two ferromagnetic metal layers separated by a nonferromagnetic metal layer. The physical origin of the GMR effect is that the application of an external magnetic field causes a variation in the relative orientation of neighboring ferromagnetic layers. This in turn causes a change in the spin-dependent scattering of conduction electrons and thus the electrical resistance of the structure. The resistance of the structure thus changes as the relative alignment of the magnetizations of the ferromagnetic layers changes.

A particularly useful application of GMR is a sandwich structure, called a spin valve, comprising two uncoupled ferromagnetic layers separated by a nonmagnetic metal layer in which the magnetization of one of the ferromagnetic layers is pinned. The pinning may be achieved by depositing the layer onto an antiferromagnetic layer which exchange-couples to the pinned layer. The unpinned layer or free ferromagnetic layer is free to rotate in the present of any small external magnetic field.

Spin valve structures have been identified in which the resistance between two uncoupled ferromagnetic layers is observed to vary as cosine of the angle between the magnetizations of the two layers and is independent of the direction of current flow. The spin valve produces a magnetoresistance that, for selected combinations of materials, is greater in magnitude than AMR. In general, the larger $\Delta R/R$ is the better the spin valve's performance.

Spin valve (GMR) read heads require two main improvements for future high density recording needs, which are larger signal for detecting ever smaller magnetic bits and smaller read gaps requiring thinner pinning layers. Most previously described spin valve use NiO as the antiferromagnetic or pinning layer deposited adjacent to the pinned layer for exchange-coupling to fix or pin the magnetization of the pinned layer. Through exchange anisotropy with the NiO antiferromagnetic layer, the magnetization of the pinned layer is held rigid against small field excitations, such as those that occur from the signal field to be sensed. However, the low magnetic anisotropy energy for NiO, less than $10^5$ erg/cm$^2$, led to a weak pinning field and a high critical thickness, greater than 400 Å, for pinning layer. Additionally, the low ordering temperature of 250° C. led to thermally unstable pinning.

U.S. Pat. No. 5,665,465 issued Sep. 9, 1997 to Gyorgy et al. discloses an article including a magnetically hard oxide layer in contact with a magnetically soft oxide layer, with spins in the latter at room temperature exchange-coupled to the oriented spins in the former. Both hard oxide layer and soft oxide layer consist of ferrimagnetic spinel-type oxides. However, Gyorgy et al. only teaches the existence of exchange anisotropy between two magnetic metal oxide layers, which are only in expitaxial crystalline structures. Gryorgy does not teach about the exchange anisotropy between a magnetic metal oxide layer and a metallic layer. Furthermore, Grygory does not teach or suggest the use of the exchange-coupled structures in spin valves.

An article entitled "Enhanced Blocking Temperature in NiO Spin Valves: Role of Cubic Spinel Ferrite Layer Between Pinned Layer and NiO" by R. F. C. Farrow et al. submitted to Applied Physics Letters on Jun. 19, 2000 discloses simple spin valves including an interfacial oxidized Fe layer inserted at the pinned layer/antiferromagnetic NiO layer interface to increase blocking temperature and pinning field for spin valves. The Fe-oxide layer is converted to a cubic spinel ferrite ($Nio_{0.8}Fe_{2.2}O_4$) layer by solid state reaction with the NiO. Unfortunately, spin valves produced by this technique do not give larger signals for detecting smaller magnetic bits and do not have a small read gap.

There is a need, therefore, for an improved spin valve including pinning layers that overcome the above difficulties.

OBJECTS AND ADVANTAGES

Accordingly, it is a primary object of the present invention to provide spin valves having an exchange anisotropy between a magnetically hard ferrite layer with polycrystalline structure exchange-coupled to a magnetic metal pinned layer.

It is another object of the present invention to provide a spin valve with larger signal for detecting smaller magnetic bits.

It is a further object of the invention to provide spin valves with smaller read gaps.

It is an additional object of the invention to provide spin valves including highly corrosion-resistant pinning layers.

It is another object of the present invention to provide high efficiency spin valves, in which current is not shunted through the pinning layer.

It is a further object of the present invention to provide a method of producing spin valves having above properties.

SUMMARY

These objects and advantages are attained by an exchange-coupled magnetic structure having cobalt-ferrite pinning layers exchange-coupling with adjacent ferromagnetic metal layers. Cobalt-ferrite is known to be a ferrimagnetic insulator with high magnetic anisotropy and high Curie temperature. In addition, cobalt-ferrite is a stable oxide phase highly resistant to corrosion.

A conventional magnetoresistive sensor, such as a spin valve or a tunnel junction valve, includes an antiferromagnetic layer, a ferromagnetic pinned layer having a magnetization pinned by the antiferromagnetic layer, a ferromagnetic free layer with a magnetization independent of the ferromagnetic pinned layer, and a spacer layer between the ferromagnetic pinned layer and the ferromagnetic free layer, which is a conductive spacer layer for a spin valve and is an insulating barrier layer for a tunnel junction valve.

According to a first embodiment of the present invention, a cobalt-ferrite pinning layer is used in place of the antiferromagnetic layer. Since the cobalt-ferrite layer has a magnetic moment (unlike an antiferromagnetic pinning layer) the design must take this magnetic moment into account. Since a reduced pinning layer thickness is highly desirable, there is no inherent problem with the pinning layer contributing magnetic moment.

According to a second embodiment of the present invention, the cobalt-ferrite layer is used in an AP-pinned spin valve design which is similar in structure to the magnetoresistive sensor of the first embodiment except that the pinned layer is replaced by an AP pinned structure. An AP pinned structure typically includes a first and a second magnetic layer and an AP spacer layer disposed between the first and second magnetic layers. The first magnetic layer located adjacent to the spacer layer than the second magnetic layer is made of cobalt-ferrite. The net moment of the AP pinned structure is reduced and the coupling field is increased relative to the pinned layer of the first embodiment since the second magnetic layer couples antiparallel to the cobalt-ferrite layer.

For most AP pinned spin valves, the AP spacer layer is typically made of Ru (although other paramagnetic metals, e.g. Cu, may be suitable). The cobalt-ferrite layer may require a more complex structure: ferrite/magnetic metal coupling structure including a cobalt-ferrite layer contacting a magnetic metal layer, to obtain the best results. This structure is used in either or both first and second magnetic layers of an AP pinned spin valve according to a third embodiment of the present invention. Since the cobalt-ferrite layer has a magnetic moment, the magnetic metal layer may be very thin. Typically, 5 Å thick is sufficient to enhance AP coupling.

A layer of magnetically soft ferrite material, such as manganese zinc ferrite, with a ferrite/magnetic metal coupling structure may also be used in an AP-free structure design according to a fourth embodiment of the present invention. An AP-free magnetoresistive sensor has a basic structure similar to the magnetoresistive sensor described in the first embodiment except that it utilizes an AP-free structure. An AP-free structure typically includes a first magnetic layer, a second magnetic layer, and an AP spacer layer between the first and the second magnetic layers. The first magnetic layer includes a first soft ferrite layer contacting a first magnetic metal layer adjacent to the AP spacer layer. The second magnetic layer is made of a soft ferromagnetic metal. The soft ferrite layer is electrically non-conducting as far as a magnetoresistive sensor is concerned. The second magnetic layer is coupled through the AP spacer layer to the soft ferrite layer. This layer may be nanolayered with a ferromagnetic metal to improve the AP coupling for the AP free structure.

Alternatively, two soft ferrite/magnetic metal structures may be used for both the first and second magnetic layers in an AP-free structure.

A cobalt-ferrite layer may be added to a magnetoresistive sensor, wherein an antiferromagnetic layer is between the cobalt-ferrite layer and the pinned layer, to assist in biasing according to a fifth embodiment of the present invention. The antiferromagnetic layer pins both the cobalt-ferrite layer and the pinned layer. The magnetic moment of the cobalt-ferrite layer is parallel or unparallel to the magnetic moment of the pinned layer depending on the differences in the coercivities of these two layers.

According to a sixth embodiment of the present invention, cobalt-ferrite layers of magnetoresitive sensor, such as spin valves, are made by reactive co-sputtering of Co and Fe in an oxygen/argon gas mixture. Two underlayers of Cr and RuAl are sputter-deposited on a glass substrate. A cobalt-ferrite layer is deposited onto these underlayers by reactive co-sputtering of Co and Fe. These underlayers are used to ensure the glass substrate temperature reached 250° C. during the cobalt-ferrite layer growth. Following the deposition of the cobalt-ferrite layer, the glass substrate is cut into several pieces, which are loaded into an ultra high vacuum evaporation system for the depositions of the pinned layer, spacer layer and the free layer. The surface of the cobalt-ferrite layer is cleaned by exposure to a beam of oxygen atoms to remove impurities (adsorbed during transfer) prior to deposition of the pinned layer. During the deposition of the pinned layer the substrate temperature is held at about 200° C. A spin valve made by this method typically has a very small signal, about 0.3%, due to several factors including the material of the spacer layer, the presence of the metallic Cr/RuAl underlayers and the non-optimal thickness of the pinned layer. Nevertheless, the pinning field is achieved about 60 Oe, and the blocking temperature is greater than 200° C.

The cobalt-ferrite layer may be formed by reactive sputtering of $CoFe_2$ target in oxygen/argon gas mixture according to a seventh embodiment of the present invention. The cobalt-ferrite layers are deposited onto a glass substrate by reactive sputtering of $CoFe_2$ target in an oxygen/argon gas mixture with the substrate temperature held at room temperature during the film growth. Following the deposition of the cobalt-ferrite layer, the pinned layer, the spacer layer, and the free layer are also deposited at room temperature by sputtering. Spin valves made by this method have very substantial magnetoresistance values in spite of the fact that the substrate temperature is not optimized. A wide range of oxygen conditions is used during cobalt-ferrite layer formation.

Alternatively, the cobalt-ferrite layer may be formed by evaporation of Co and Fe from a Co/Fe alloy source (containing 40% Fe) along with a flux of oxygen atoms from a RF oxygen atom beam source onto Si, $SiO_2$ and single crystal MgO (001) substrates with the substrate temperature held at 250° C.

Analogous methods may be used to deposit the magnetically soft ferrite layer in an AP-free spin valve.

Magnetoresistive sensors having cobalt-ferrite layers as described in above embodiments are incorporated in a magnetoresistive (MR) read write head according to an eighth embodiment of the present invention. A MR read/write head includes a first shield contacting a first gap, a second shied contacting a second gap, and a spin valve disposed between the first and second gaps.

MR read/write heads of the type described in the eighth embodiment are incorporated in a disk drive according to a ninth embodiment of the present invention. A disk drive includes a magnetic recording disk connected to a motor and a MR read/write head connected to an actuator. The motor spins the magnetic recording disk with respect to the MR read/write head, and the actuator positions the GMR head relative to the magnetic recording disk.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Magnetically hard ferrites, such as cobalt-ferrite or gallium-ferrite, are known to be ferrimagnetic insulators with high magnetic anisotropy and high Curie temperature. Cobalt-ferrite, which has a spinel structure of $Co_xFe_{3-x}O_4$, with x is greater than zero and less than three and preferably less than two, has a magnetic anisotropy greater than $2\times10^6$ erg/cm$^2$, and a Curie temperature of about 520° C. In addition, cobalt-ferrite is a stable oxide phase highly resistant to corrosion. By replacing presently-used metallic and electrically conducting alloy pinning layers of spin valves with cobalt-ferrite, spin valves may achieve large signals for detecting ever smaller magnetic bits. Furthermore, because of its high anisotropy, cobalt-ferrite layer can work as a pinning layer at less than 200 Å thickness, thinner than presently used, which can reduce the read gaps of spin valves.

Figure 1:
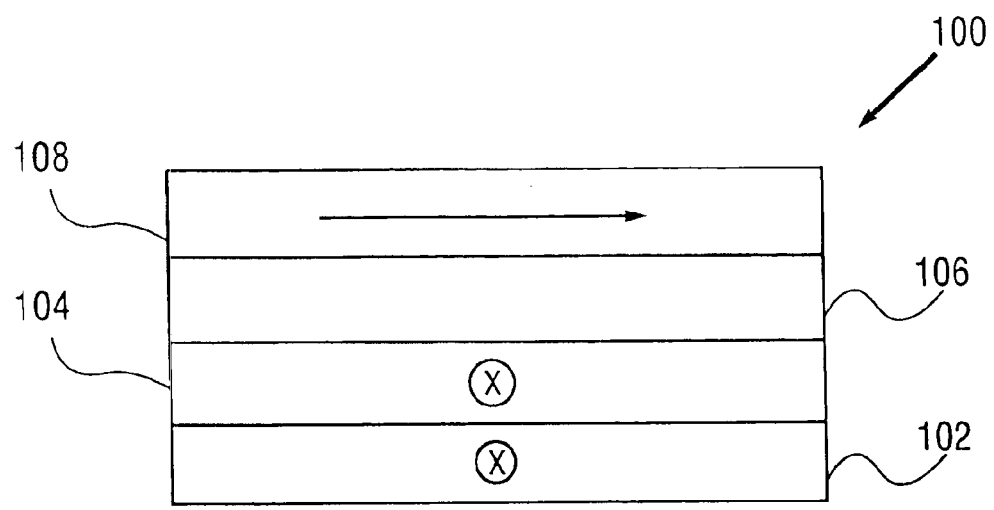
FIG. 1 depicts a cross-sectional schematic diagram of a simple magnetoresistive sensor having a cobalt-ferrite pinning layer according to a first embodiment of the present invention.

The ferrite layer may be used in place of the antiferromagnetic layer of a conventional magnetoresitive sensor, such as a spin valve or a tunnel junction valve, which is shown in FIG. 1 according to a first embodiment of the present invention. FIG. 1 is a cross-sectional schematic diagram of a magnetoresistive valve 100 including a cobalt-ferrite layer 102 contacting a ferromagnetic pinned layer 104, a ferromagnetic free layer 108 separated from the pinned layer 104 by a layer 106. In a spin valve, the layer 106 is a conductive spacer layer and a direction of a sense current is parallel to the spin valve layers. In a tunnel junction valve, the layer 106 is an insulating barrier layer, and the direction of the sense current is perpendicular to the tunnel junction valve layers.

Ferromagnetic free layer 108 typically includes a material containing Ni, Fe, Co or alloys of Ni, Fe and Co such as NiFe, NiCo, and FeCo. The ferromagnetic pinned layer 104 is typically made of Co or CoFe. The spacer layer 106 is typically made of Cu, Ag, Au or their alloys for a spin valve, and is typically made of $Al_2O_3$, AlN or MgO for a tunnel junction valve.

Unlike an antiferromagnetic layer, the cobalt-ferrite layer 102 has a magnetic moment, thus an exchange bias field from the moment of cobalt-ferrite layer 102 biases a magnetic moment of the pinned layer 104. Furthermore, because of its high anisotropy, a pinning layer with a thickness less than 200 Å can be used, which reduces the read gap of the spin valve. In addition, the cobalt-ferrite layer may act as a specular scattering layer for sensing current. Thus the efficiency of the spin valve is increased.

Figure 2:
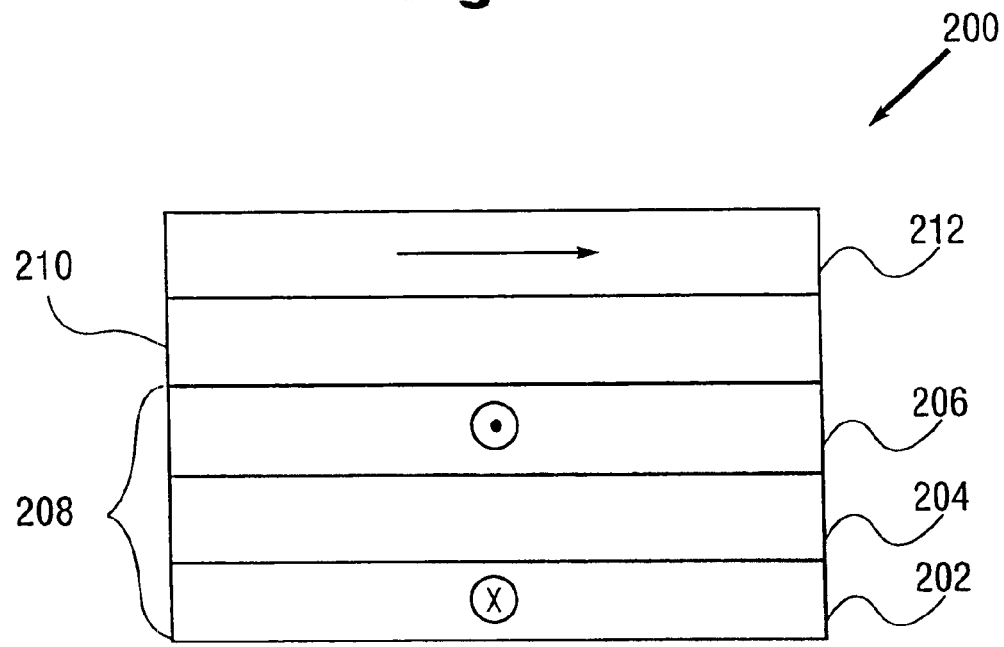
FIG. 2 depicts a cross-sectional schematic diagram of an AP pinned spin valve having a magnetic layer of AP-pinned structure containing cobalt-ferrite according to a second embodiment of the present invention.

The ferromagnetic pinned layer 104 and the ferromagnetic free layer 108 of the spin valve 100 may be replaced by AP structures. Suitable magnetic ferrite layers may be used in an AP pinned structure design, which is shown in FIG. 2 according to a second embodiment of the present invention. FIG. 2 is a cross-sectional schematic diagram of an AP pinned spin valve 200 having a free layer 212, an AP pinned structure 208, and a spacer layer 210 between the AP pinned structure 208 and the free layer 212. The AP pinned structure 208 includes a first magnetic layer 202, a second magnetic layer 206, and an AP spacer layer 204. The first magnetic layer 202 comprises cobalt-ferrite. The second magnetic layer 206 couples antiparallel to the cobalt-ferrite layer 202, thus the net moment of the AP pinned layer 208 is reduced and the pinning is increased. The materials of the free layer 212, spacer layer 210, and the second magnetic layer 206 of AP pinned spin valve 200 are similar to those of the spin valve 100 describe in FIG. 1. The AP spacer layer 204 is typically made of Ru, Cr, Rh, Ir, and their alloys.

Figure 3A:
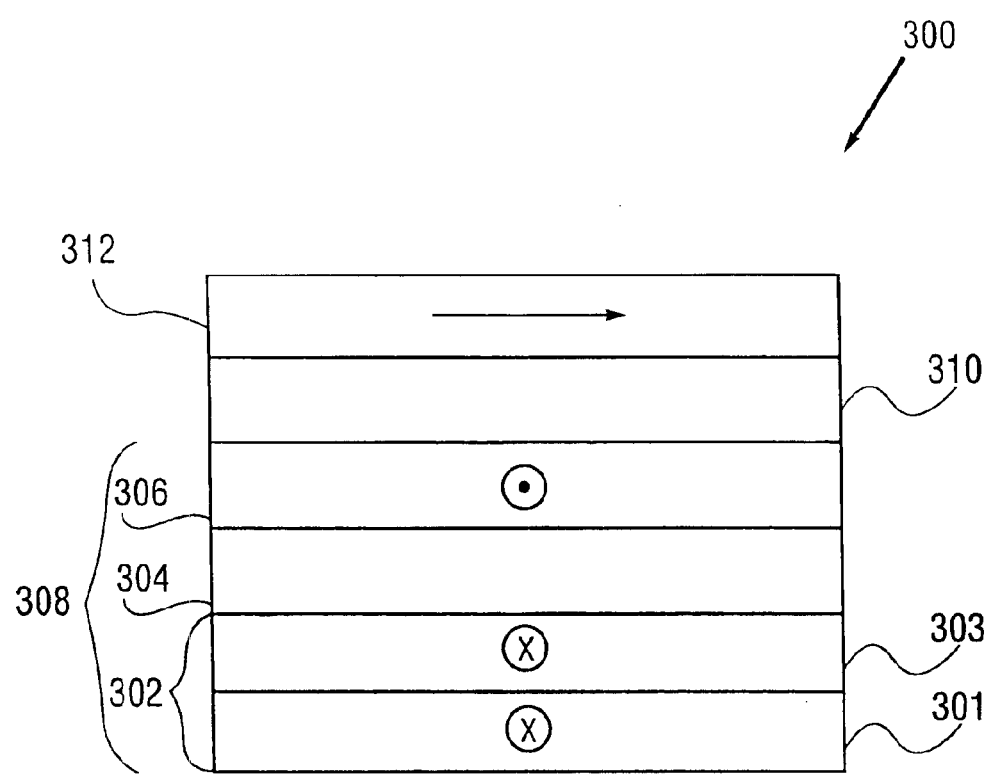
FIGS. 3A–B depict cross-sectional schematic diagrams of AP pinned spin valves having either or both two magnetic layers of the AP-pinned structure containing ferrite/magnetic metal exchange-coupled magnetic structures according to a third embodiment of the present invention.

As mentioned above, for most AP pinned spin valves, the AP spacer layer is typically made of Ru. The basic cobalt-ferrite layer may be improved by using a slightly more complex structure, such as a ferrite/magnetic metal exchange-coupled magnetic structure, to obtain the best results, which is shown in FIG. 3A according to a third embodiment of the present invention. FIG. 3A depicts a cross-sectional schematic diagram of an AP pinned spin valve 300. Spin valve 300 includes a free layer 312, an AP pinned structure 308, and a spacer layer 310 between the AP pinned structure 308 and the free layer 312.

The AP pinned structure 308 includes a first magnetic layer 302, a second magnetic layer 306, and an AP spacer layer 304 between the first magnetic layer 302 and the second magnetic layer 306. The first magnetic layer 302 includes a cobalt-ferrite layer 301 and a magnetic metal layer 303 adjacent to the AP spacer layer 304.

The materials of the free layer 312, second pinned layer 306, spacer layer 308 and AP spacer layer 304 of AP pinned spin valve 300 are similar to those of the spin valve 200 described in FIG. 2. The magnetic metal layer 303 is typically made of Co or CoFe. Since the cobalt-ferrite layer 301 has a moment, the magnetic metal layer 303 can be very thin. The thickness of the metallic layer 303 is typically between about 5 Å and about 30 Å. Typically, a thickness of about 5 Å is sufficient to produce AP coupling for AP pinned structure.

Figure 3B:
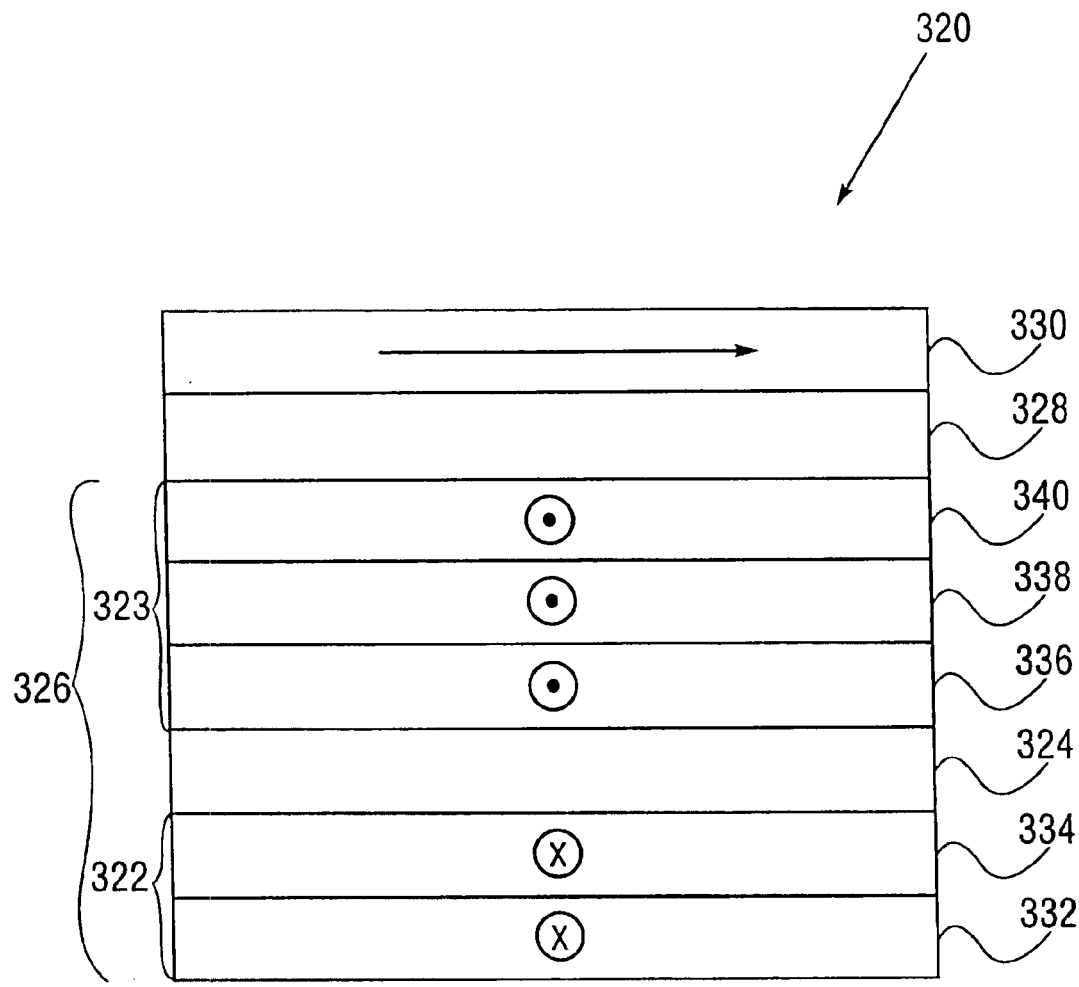

Alternatively, a ferrite/magnetic metal exchange-coupled magnetic structure as described in the first magnetic layer 302 of the AP pinned spin valve 300 with respect to FIG. 3A may be further used in the second magnetic layer 306 of the AP pinned spin valve 300. FIG. 3B illustrates a cross-sectional schematic diagram of an AP pinned spin valve 320 with an AP-pinned structure containing two cobalt-ferrite layers. AP pinned spin valve 320 includes a free layer 330, an AP pinned structure 326, and a spacer layer 328 between the free layer 330 and the AP pinned structure 326. The AP pinned structure 326 includes a first magnetic layer 322, a second magnetic layer 323, and an AP spacer layer 324 between the first magnetic layer 322 and the second magnetic layer 323. The first magnetic layer 322 includes a first cobalt-ferrite layer 332 coupling to a first metal layer 334 adjacent to the AP spacer layer 324. The second magnetic layer 323 includes a ferromagnetic pinned layer 340 contacting the spacer layer 328, a second cobalt-ferrite layer 338 proximate the ferromagnetic layer 340, and a second metal layer 336 coupling to the second cobalt-ferrite layer 338. The metal layers 336 and 334 are typically made of Co and CoFe.

Figure 4A:
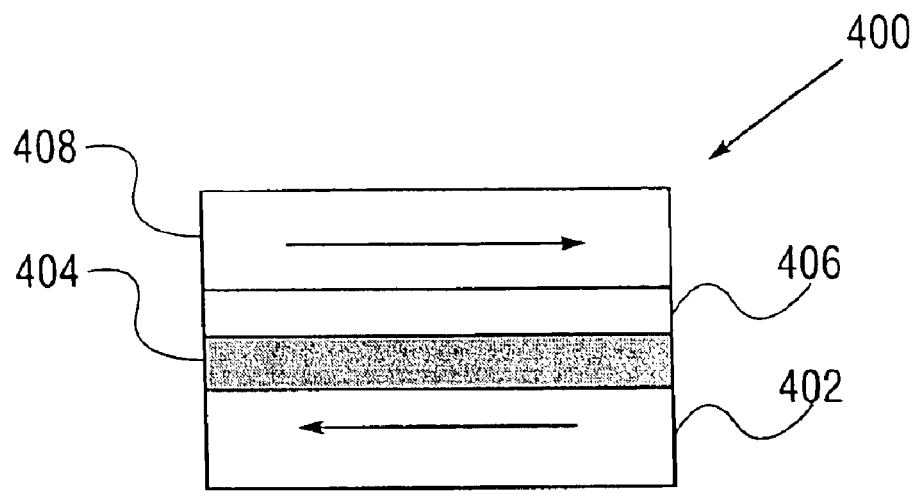
FIG. 4A depicts a cross-sectional schematic diagram of an AP-free structure having a magnetic layer containing magnetically soft ferrite according to a fourth embodiment of the present invention.

An analogous ferrite/magnetic metal exchange-coupled magnetic structure may also be used in an AP-free structure design according to a fourth embodiment of the present invention. FIG. 4A depicts a cross-sectional schematic diagram showing an AP free structure 400 but not an entire spin- or tunnel-valve. AP free structure 400 includes a first magnetic layer 408, a second magnetic layer 402, and an AP spacer layer 404 between the first and second magnetic layers 402 and 408. The first magnetic layer 408 is typically made of soft magnetic ferrite, and the second magnetic layer 402 is typically made of a magnetic metal such as Co or CoFe. Layer 408 is electrically non-conducting layer as far as giant magnetoresistive (GMR) spin valves are concerned. Magnetic metal layer 402 is coupled, through the AP spacer layer 404, to the soft ferrite layer 408. The ferrite layer 408 may be nanolayered with a metal layer 406 to improve the AP coupling within the AP free structure 400. The metal layer 406 is typically made of Co and CoFe. In this case, "soft", i.e. low coercivity ferrite should be used. Manganese zinc ferrites among others are commonly used for low coercivity magnetic applications.

Figure 4B:
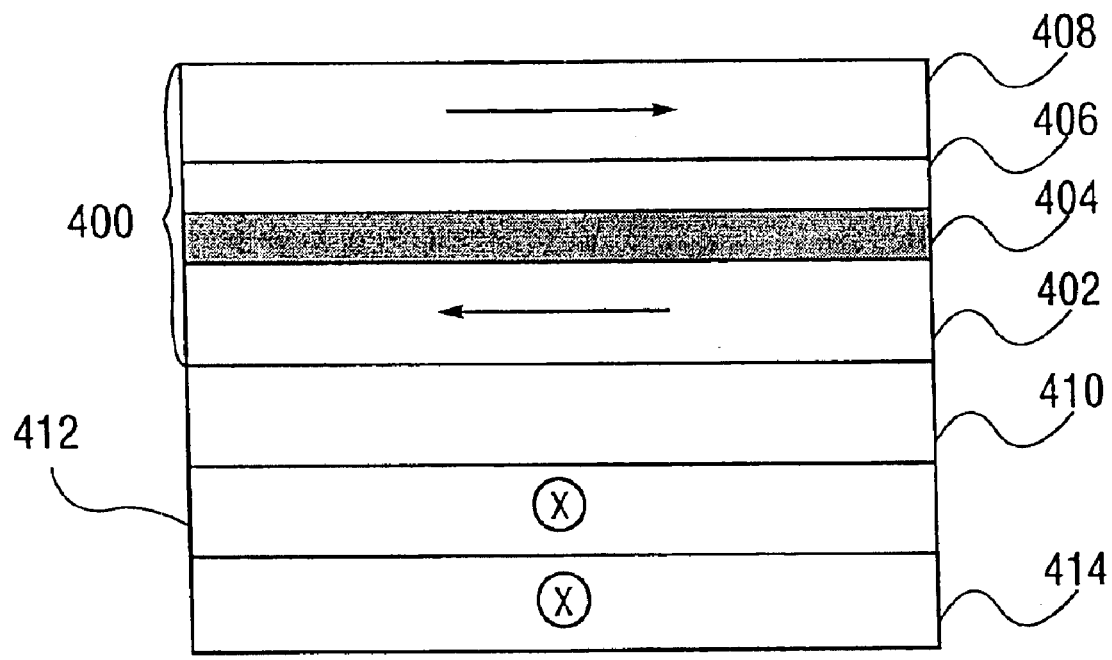
FIG. 4B depicts a cross-sectional schematic diagram of an AP-free spin valve including an AP-free structure of the type depicted in FIG. 4A.

FIG. 4B illustrates an AP free spin valve 420 having an AP free structure 400 as described in FIG. 4A. AP free spin valve 401 includes an AP free structure 400, a pinned layer 412, a spacer layer 410 between the pinned layer 412 and the AP free structure 400, and a cobalt-ferrite pinning layer 414 proximate the pinned layer 412. The second magnetic metal layer 402 of the AP free structure 400 is in contact with the spacer layer 410. The second magnetic metal layer 402, pinned layer 412, spacer layer 410, and AP spacer layer 404 of spin valves 420 are made of the materials similar to those of the spin valves 100 and 300.

Figure 4C:
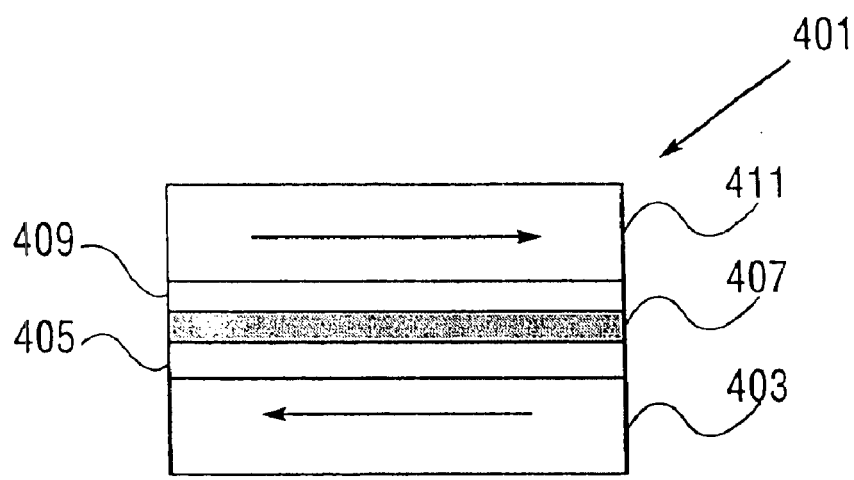
FIG. 4C depicts a cross-sectional schematic diagram of an AP-free structure having two magnetic layers containing magnetically soft ferrite.

FIG. 4C is a cross-sectional schematic diagram showing an alternative AP free structure 401. The first magnetic layer 411 of the AP free structure 401 is made of soft ferrite, which is nanolayered with a first metal layer 409, and the second magnetic layer 403 is also made of soft ferrite, which also is nanolayered with a second metal layer 405.

Figure 4D:
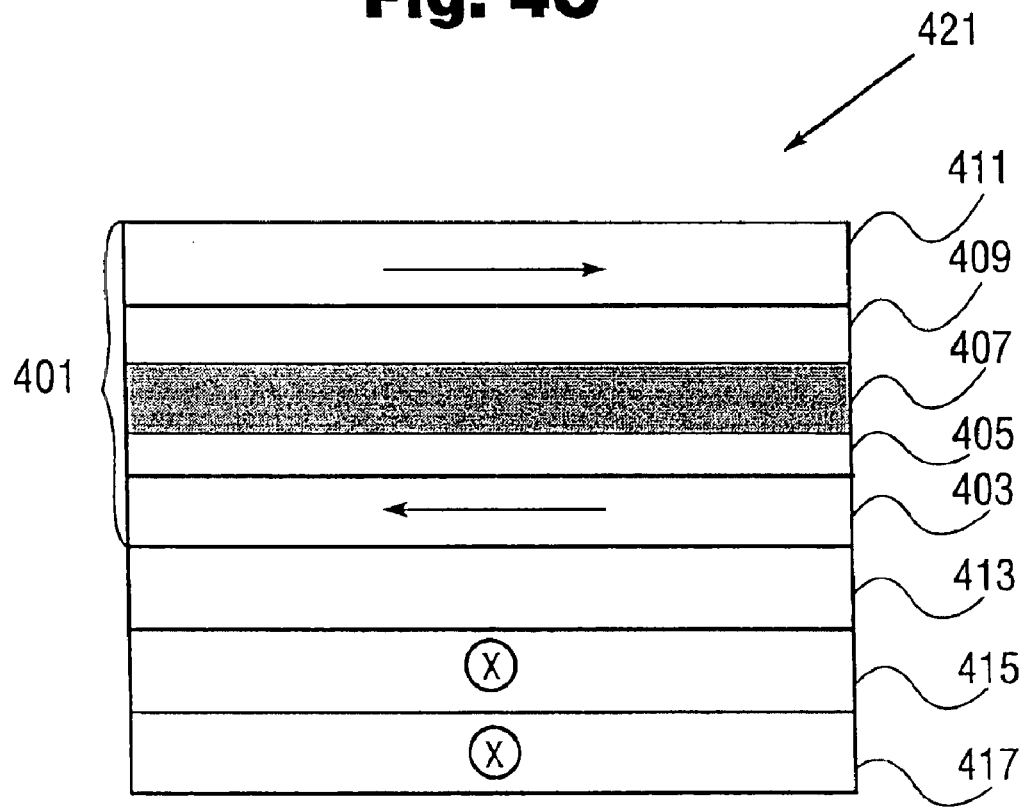
FIG. 4D depicts a cross-sectional schematic diagram of an AP-free spin valve including an AP free structure of the type depicted in FIG. 4C.

A cross-sectional schematic diagram of an AP free spin valve 421 having AP free structure 401 as described in FIG. 4C is shown in FIG. 4D. AP free spin valve 421 includes an AP free structure 401, a pinned layer 415, a spacer layer 413 between the AP free structure 401 and the pinned layer 415, and a cobalt-ferrite pinning layer 417 pinning a magnetization of the pinned layer 415.

Figure 5:
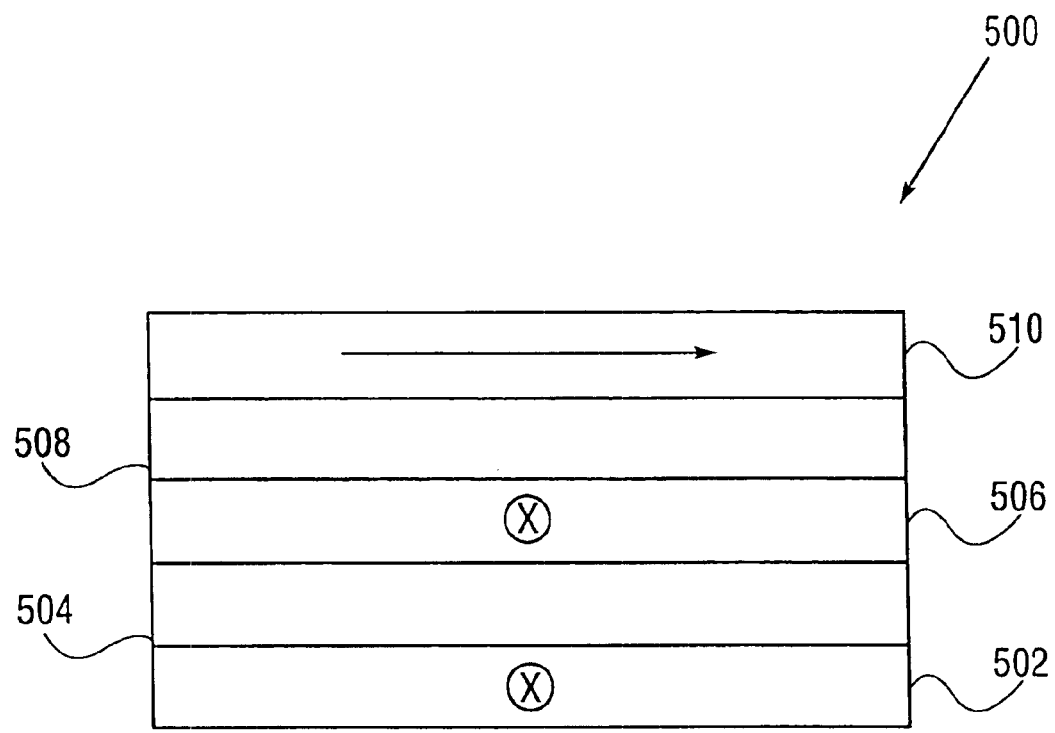
FIG. 5 depicts a cross-sectional schematic diagram of a simple spin valve having a cobalt-ferrite layer adjacent the antiferromagnetic layer according to a fifth embodiment of the present invention.

Furthermore, a cobalt-ferrite layer may be added to a simple spin valve to assist in magnetization biasing, magnetization stabilizing, and current confining as shown in FIG. 5 according to a fifth embodiment of the present invention. FIG. 5 depicts a cross-sectional schematic diagram of a simple spin valve 500. Spin valve 500 includes a free layer 510, a pinned layer 506, a spacer layer 508 between the free layer 510 and the pinned layer 506, an antiferromagnetic layer 504 pinning the magnetization of the pinned layer 506, and a cobalt-ferrite layer 502 below the antiferromagnetic layer 504. Materials of all spin valve layers of the spin valve 500 are similar to those of the spin valve 100 described in FIG. 1, and the antiferromagnetic layer 504 is typically made of a material containing Mn, such as FeMn, PtMn, IrMn, PdPtMn and NiMn. The antiferromagnetic layer 504 pins both the ferrite layer 502 and the pinned layer 506. The moment of the cobalt-ferrite layer 502 is shown parallel to the moment of the pinned layer 506 in FIG. 5. However, the moment of the cobalt-ferrite layer 502 may be pinned in a different direction by utilizing large differences in the coercivities of the cobalt-ferrite layer 502 and the pinned layer 506. The pinned layer 504 or the free layer 510 may have AP structures containing ferrite layers. The ferrite layer 502 also may be magnetically stabilized further by incorporating it into an AP structure. Furthermore, an AP free structure may be used along with an AP pinned structure. Likewise, the spin valve 500 can constitute an antiferromagnetically pinned spin valve (by substitution of material in layer 502) rather than a ferrite pinned spin valve.

Alternatively, the AP structures containing cobalt-ferrite layers described in above Figures, except FIG. 1, may also be used for magnetic tunnel junction valves.

Figure 6:
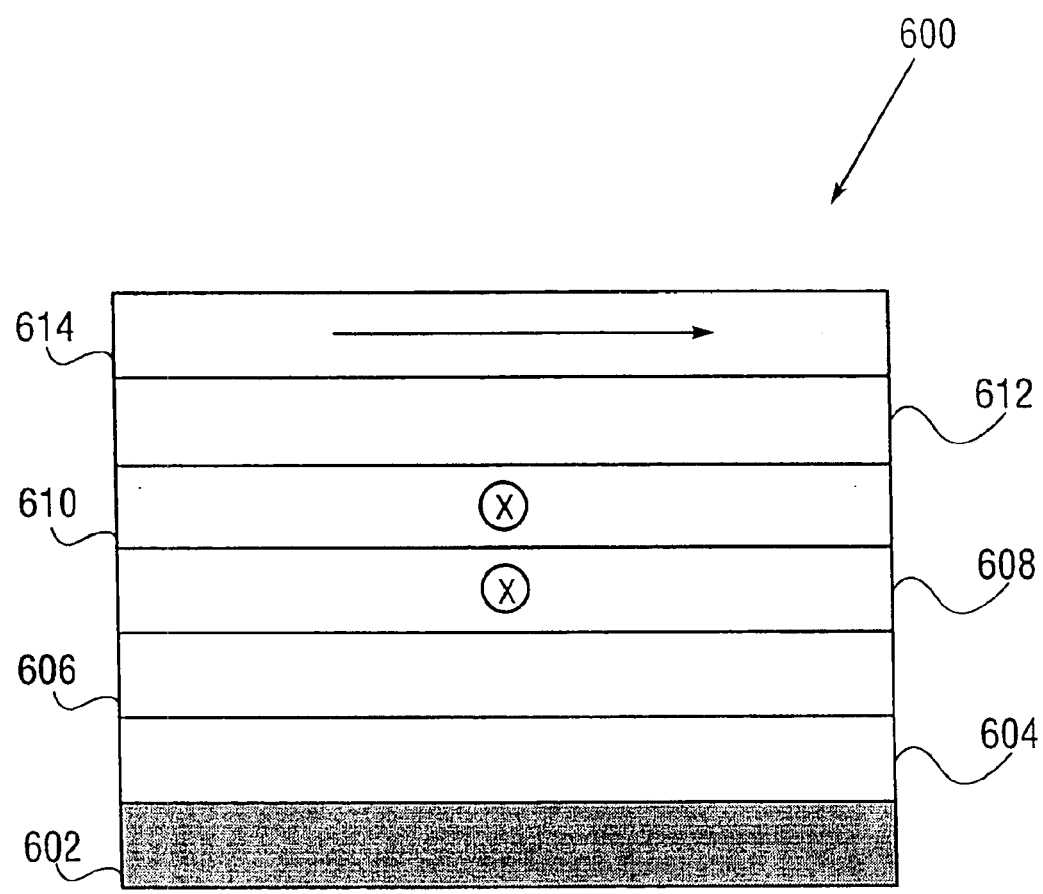
FIG. 6 depicts a cross-sectional of a simple spin valve made by a method according to a sixth embodiment of the present invention.

FIG. 6 is a cross-sectional schematic diagram of a simple spin valve 600 having a cobalt-ferrite pinning layer made by a method according to a sixth embodiment of the present invention. A first underlayer 604 of RuAl about 200 Å thick is sputter-deposited onto a glass substrate 602, and a second underlayer 606 of Cr about 85 Å thick is sputter-deposited onto the first underlayer 604. Cobalt-ferrite layer 608 of 138 Å thick is deposited onto underlayers 604 and 606 by reactive co-sputtering of Co and Fe in an oxygen/argon gas mixture. The underlayers 604 and 606 are used to ensure the temperature of the substrate 602 reached 250° C. during the deposition of the cobalt-ferrite layer 608 since the formation of the cobalt-ferrite layer 608 requires substrate 602 temperature above 200° C. during film deposition by pulsed laser ablation or sputtering. Following the cobalt-ferrite layer 608 deposition, on the glass substrate 602, the glass substrate 602 is cut into several pieces, which are loaded into an ultra high vacuum evaporation system for the depositions of the pinned layer 610, spacer layer 612, and the free layer 614. The pinned layer 618 is typically made of CoFe permalloy of about 167 Å thick. The spacer layer 612 is made of Au of about 45 Å, and the free layer 614 is made of permalloy of Co, Ni and Fe of about 50 Å thick. The surface of the cobalt-ferrite layer 608 is cleaned by exposure to a beam of oxygen atoms to remove impurities prior to the deposition of the pinned layer 610. During the deposition of the pinned layer 610, the substrate 602 temperature is held at 200° C. The spin valve 600 shows very small signal (about 0.3%) due to several factors including the material of the spacer layer 612, presence of the underlayers 602 and 604, and the non-optimal thickness of the pinned layer 610.

Figure 7:
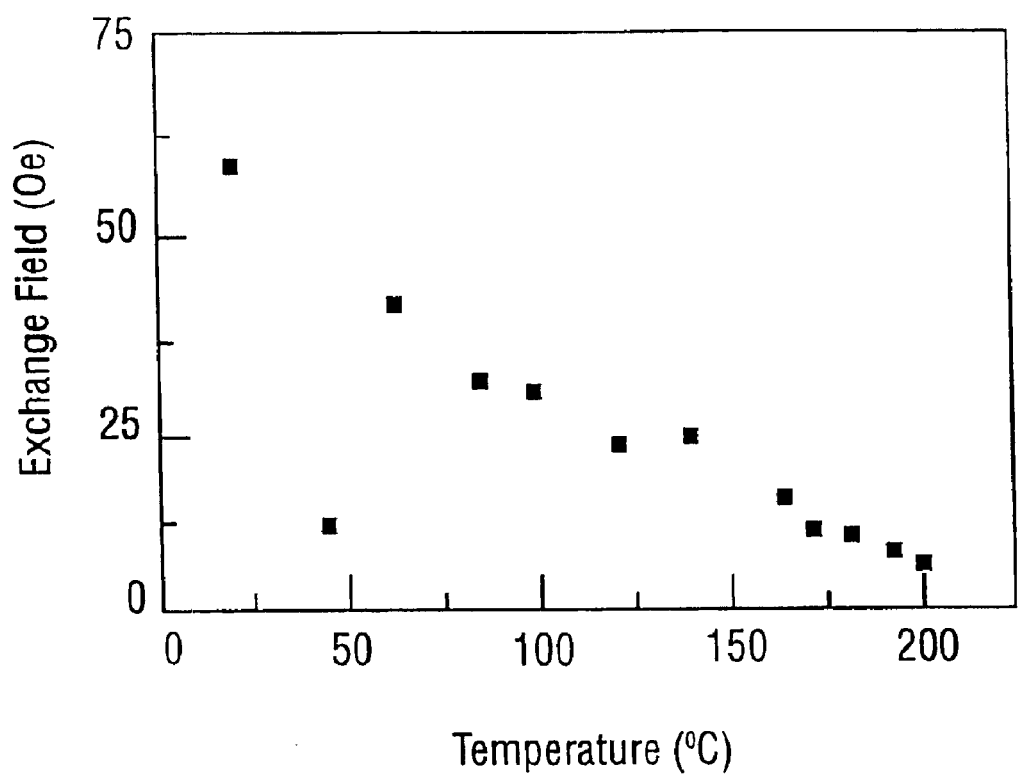
FIG. 7 depicts a plot of exchange field as a function of blocking temperature of the spin valve depicted in FIG. 6.

Nevertheless, the exchange pinning field is achieved about 60 Oe and the blocking temperature is greater than 200° C., which are shown in FIG. 7. Analysis of the composition of the cobalt-ferrite layer shows a cobalt content of 4%, which is equivalent with x equal to 0.33, compared with stoichiometric cobalt-ferrite of 14.3% cobalt, which is equivalent to x equal to 1. This indicates that the cobalt-ferrite composition is far from optimal for the maximum magnetic anisotropy, nevertheless, significant pinning and a blocking temperature greater than 200° C. for a ferrite layer much thinner than 200 Å is demonstrated.

Figure 8:
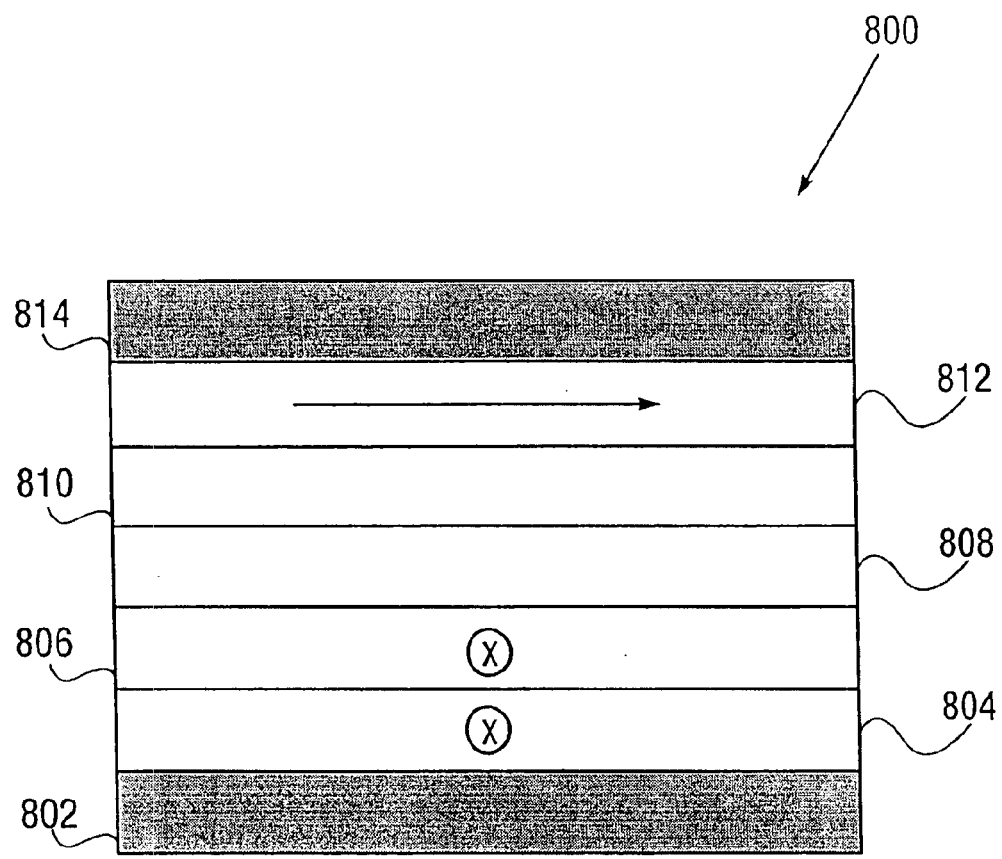
FIG. 8 depicts a cross-sectional schematic diagram of a simple spin valve made by a method according to an seventh embodiment of the present invention.

FIG. 8 depicts a cross-sectional schematic diagram of a sample spin valve 800 having a cobalt-ferrite pinning layer made by a preferred method according to an seventh embodiment of the present invention. Cobalt-ferrite layer 804 is deposited onto a glass substrate 802 by reactive sputtering of $Co_xFe$ composition targets in an $O_2$/Ar gas mixture, where x is greater than zero and less than three. The cobalt-ferrite layer 804 of a thickness between about 50 Å and about 800 Å is deposited directly on the glass substrate 802 held at room temperature during the cobalt-ferrite layer 804 growth. Following the deposition of the cobalt-ferrite layer 804, a pinned layer 806 of Co, CoFe or permalloy 30 Å thick, a spacer layer 808 of Cu, Ag or Au 25 Å thick, a nanolayer 810 of Co or Co alloy 5 Å thick, a free layer 812 of NiFe or CoFe 40 Å thick are deposited. Furthermore, a cap layer 814 of Ru 30 Å is also deposited onto the free layer 812 to protect this layer.

Figure 9:
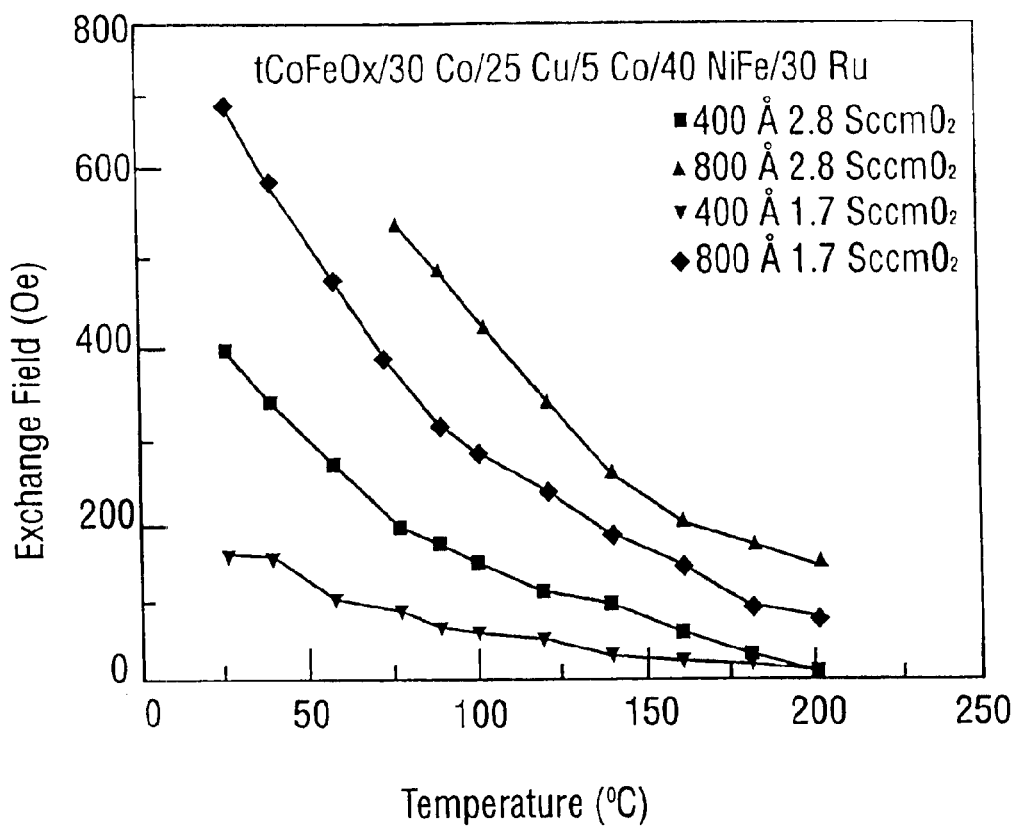
FIG. 9 depicts a graph illustrating the plots of exchange field as functions of blocking temperature of spin valve depicted in FIG. 8 with four different thicknesses of cobalt-ferrite layers at two different oxygen flow rates.

FIG. 9 shows plots of exchange bias field and the blocking temperature of spin valve 800 with two different thicknesses of the cobalt-ferrite layer 804, 400 Å and 800 Å, at two different oxygen flow rates, 2.8 sccm and 1.7 sccm. As shown in FIG. 9, the exchange field, the blocking temperature, and the thickness of the cobalt-ferrite layer 804 are much higher than those of the spin valve 600 described in FIG. 6. The higher critical thickness is likely due to the lower substrate temperature.

Figure 10:
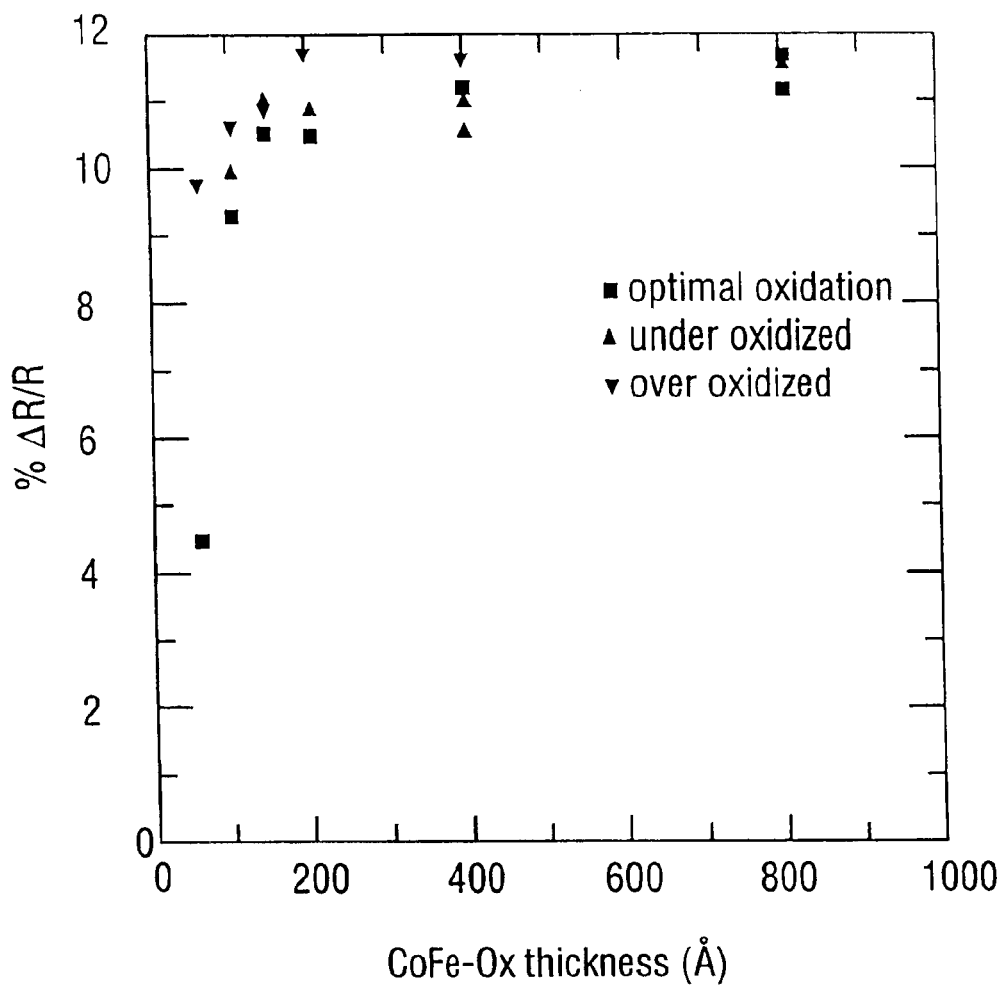
FIG. 10 depicts a graph illustrating plots of magnetoresistive ratio ($\Delta R/R$) as a function of the thickness of the cobalt-ferrite layer of the spin valve depicted in FIG. 8 at three different conditions of the oxidation.

Spin valve 800 shows substantial magnetoresistance values in spite of the fact that the substrate temperature is not optimized, either for ordering of the cobalt-ferrite or subsequent formation of the pinned layer interface. A wide range of oxidation conditions are used during cobalt-ferrite layer 804 formation. FIG. 10 shows the plots of magnetoresistance ($\Delta R/R$) as functions of cobalt-ferrite thickness for three different oxidation conditions: optimal oxidation, under-oxidized, and over-oxidized. Substantial magnetoresistance ($\Delta R/R$) greater than 10% is achieved for spin valve 800 with a thin cobalt-ferrite pinning layers, less than 200 Å, for all three oxidation conditions.

Figure 11:
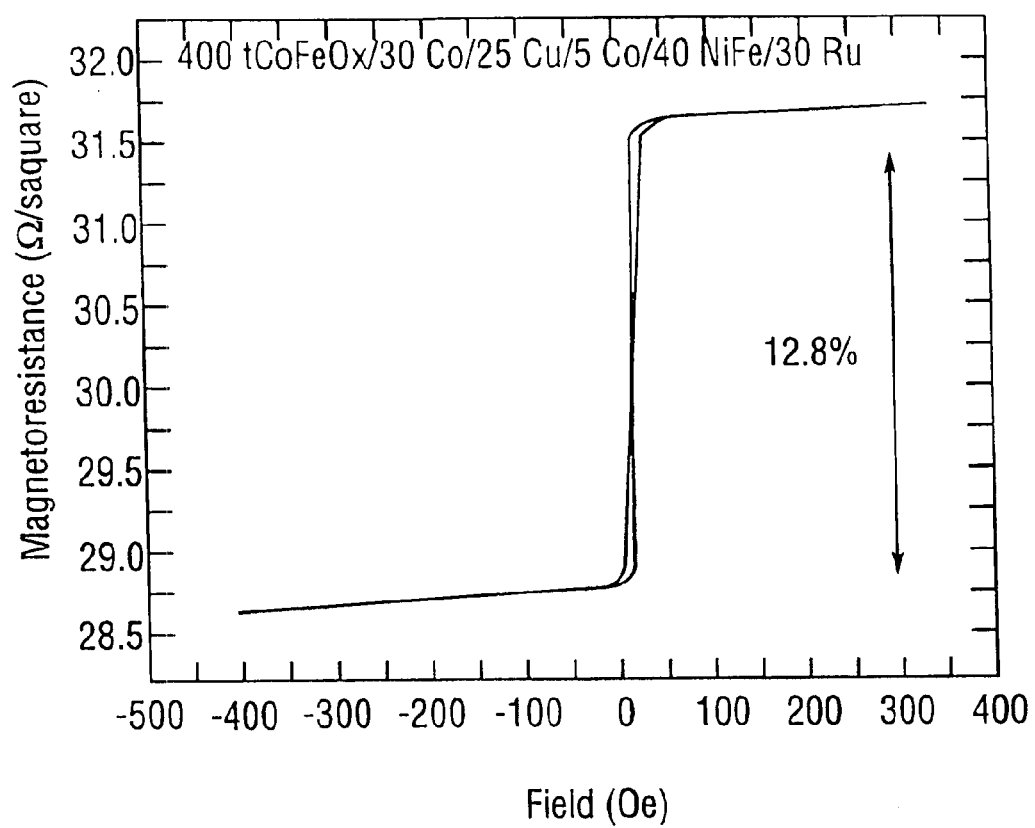
FIG. 11 shows a plot of spin valve response of the spin valve depicted in FIG. 8.

FIG. 11 shows a response loop, a plot of $\Delta R/R$ as a function of exchange bias field, for spin valve 800 having a cobalt-ferrite pinning layer 804 of 400 Å thick. The signal is very large with $\Delta R/R$ about 12.8%, and the pinning field is greater than 400 Oe. This suggests that, unlike NiO pinned-layer spin valve, AP pinning may not be necessary to maintain an adequate pinning field.

Figure 12:
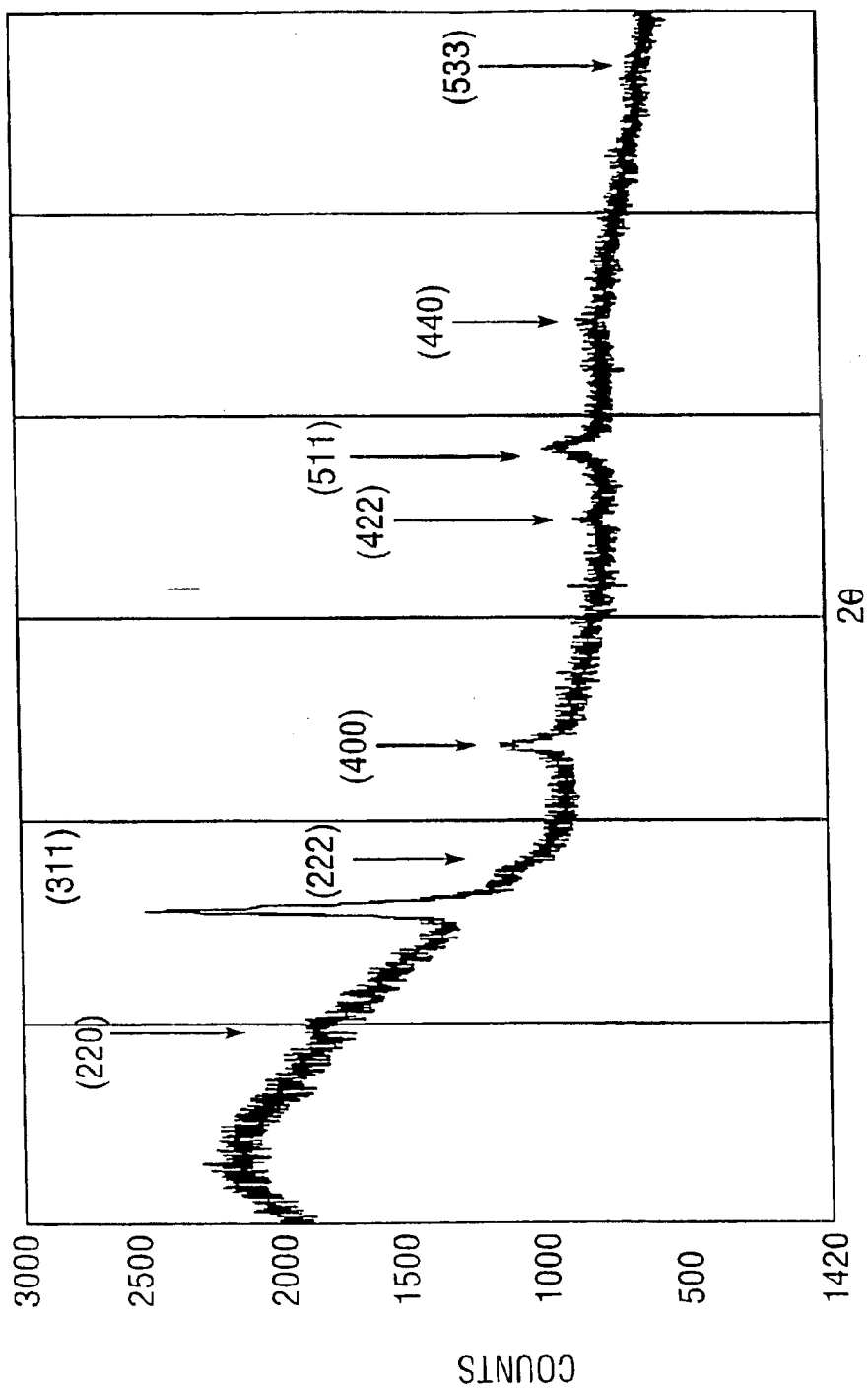
FIG. 12 shows a specular ($\theta$-$2\theta$) X-ray scan of the spin valve depicted in FIG. 8.

FIG. 12 shows a specular ($\theta$-$2\theta$) X-ray scan recorded from a calibration film of cobalt-ferrite layer 804 of about 1000 Å thick made using approximately optimal oxidation conditions. The scan shows eight peaks whose positions and intensities are in qualitative agreement with peaks in the reference X-ray data (JCPDS file #22-1086) for the cubic spinel structure $CoFe_2O_4$. These peaks also match the positions and intensities of magnetite ($Fe_3O_4$) and $Co_3O_4$, the end members of the cobalt-ferrite composition. However, since the target composition is $CoFe_2$, the film should be near $CoFe_2O_4$ composition and not of the end members, i.e. the film contains the cubic spinel cobalt ferrite.

Alternatively, the cobalt-ferrite pinning layer of another sample spin valve may be made by evaporation of Co and Fe from a Co/Fe alloy source (containing 40% Fe) and a flux of oxygen atoms from a RF oxygen beam source onto Si, $SiO_2$ and single crystal MgO (001) substrates. The substrate temperatures are norminally 250° C. The structure of this sample is analyzed to be: Au (24)/permalloy (80%) Ni 53 Å/Co(0.25)Fe(0.17)O(0.58) 219 Å/Si,$SiO_2$, MgO(001). For the polycrystalline structures grown on $SiO_2$ and Si, the exchange bias field is between about 160 Oe and about 200 Oe, which corresponds to an interfacial pinning energy density of about 0.1 erg/cm². The exchange bias is significant smaller, about 10 Oe, for the structure grown on MgO (001) possibly because of the larger grain size of the ferrite film (latice matched and possibly epitaxial with the MgO). A very effective pinning cobalt ferrite $Co_xFe_{3-x}O_4$ layer is possible for x greater than 1.

Analogous methods may be used to deposit a magnetically soft ferrite layer for an AP-free spin valve.

Figure 13:
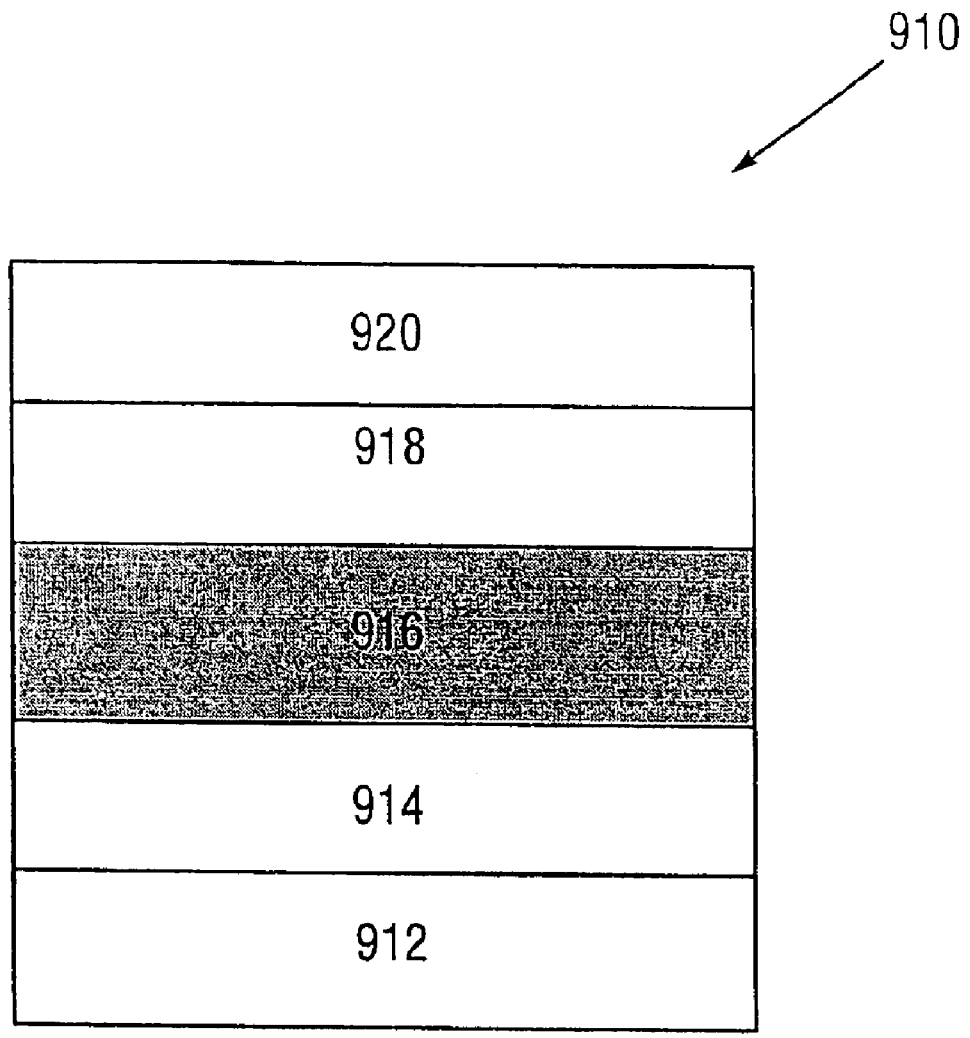
FIG. 13 is a cross-sectional schematic diagram of a magnetoresistive (MR) read/write head according to an eighth embodiment of the present invention.

A magnetoresistive sensor of the types depicted in FIGS. 1–3, 4B, 4D, 5, 6 and 8 is incorporated in a magnetoresistive (MR) read/write head as shown in FIG. 13. FIG. 13 depicts a schematic diagram of a MR read/write head 910 according to a ninth embodiment of the present invention. MR read/write head 910 includes a first shield 912 contacting a first gap 914, a second shield 920 contacting a second gap 918, and a magnetoresistive sensor 916 having cobalt-ferrite layers between the first and the second gaps 914 and 918.

Figure 14:
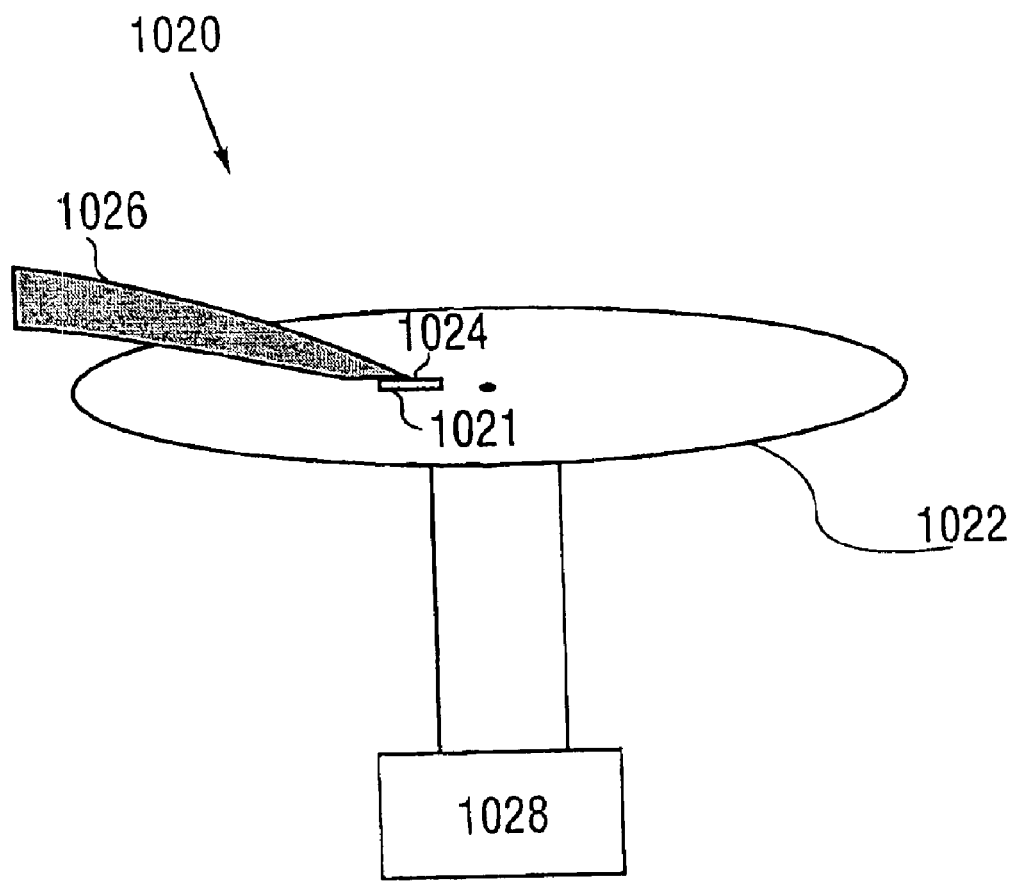
FIG. 14 is a schematic diagram of a disk drive according to a ninth embodiment of the present invention.

The MR head of the type depicted in FIG. 13 may be incorporated into a disk drive, as shown in FIG. 14. FIG. 14 shows a schematic diagram of a disk drive 1020 according to a tenth embodiment of the present invention. Disk drive 1020 includes a magnetic recording disk 1022 connecting to a motor 1028, a MR read/write head 1024 having a magnetoresistive sensor 1021 connecting to an actuator 1026. The motor 1028 spins the magnetic recording disk 1022 with respect to the MR read/write head 1024. The actuator 1026 moves the MR read/write head 1024 across the magnetic recording disk 1022 so the MR read/write head 1024 may access different regions of magnetically recorded data on the magnetic recording disk 1022.

It will be clear to one skilled in the art that the above embodiment may be altered in many ways without departing from the scope of the invention. Accordingly, the scope of the invention should be determined by the following claims and their legal equivalents.

What is claimed is:

1. A method for making a magnetoresistive sensor having a cobalt-ferrite pinning layer comprising:
   a) depositing a first cobalt-ferrite layer;
   b) depositing a ferromagnetic pinned layer proximate the first cobalt-ferrite layer;
   c) depositing a spacer layer; and
   d) depositing a ferromagnetic free layer;
   wherein the spacer layer is disposed between the ferromagnetic pinned layer and the ferromagnetic free layer.

2. The method of claim 1 further comprising depositing an antiparallel (AP) spacer layer, wherein the AP spacer layer is disposed between the first cobalt-ferrite layer and the ferromagnetic pinned layer.

3. The method of claim 2 further comprising depositing a second cobalt-ferrite layer, wherein the first and second cobalt-ferrite layers sandwich the AP spacer layer.

4. The method of claim 3 further comprising depositing a first metal layer, wherein the first metal layer is disposed between the first cobalt-ferrite layer and the AP spacer layer.

5. The method of claim 4 further comprising depositing a second metal layer, wherein the second metal layer is disposed between the second cobalt-ferrite layer and the AP spacer layer.

6. The method of claim 5, wherein the first and second cobalt-ferrite layer are deposited by co-sputtering of Co and Fe in an atmosphere consisting of oxygen and an inert gas.

7. The method of claim 6, wherein the inert gas is a gas selected from the group consisting of argon, xenon, krypton, and their mixture.

8. The method of claim 5, wherein the first and second cobalt-ferrite layer is deposited by sputtering $Co_xFe$ targets in an atmosphere consisting of oxygen and an inert gas, wherein x is greater than zero and less than three.

9. The method of claim 8, wherein the inert gas is a gas selected from the group consisting of argon, xenon, krypton, and their mixture.

10. The method of claim 5, wherein the first and second cobalt-ferrite layers are deposited by evaporation of Co and Fe from a Co/Fe alloy source and a flux of oxygen atoms from an oxygen-atom beam source on substrate.

11. The method of claim 1, wherein d) comprises:
    i) depositing a first magnetic metal layer adjacent to the spacer layer;
    ii) depositing a magnetically soft ferrite layer;
    iii) depositing a second magnetic metal layer adjacent to the magnetically soft ferrite layer; and
    iv) depositing an AP spacer layer, wherein the AP spacer layer is disposed between the first and the second magnetic metal layer.

12. The method of claim 1, wherein d) comprises:
    i) depositing a first magnetically soft ferrite layer;
    ii) depositing a second magnetically soft ferrite layer;
    iii) depositing a first magnetic metal adjacent to the first magnetically soft ferrite layer;
    iv) depositing a second magnetic metal layer adjacent to the second magnetically soft ferrite layer; and
    v) depositing an antiparallel (AP) spacer layer, wherein the AP spacer layer is disposed between the first and the second magnetic metal layers.

13. The method of claim 1, further comprising a step of depositing an anti-ferromagnetic (AF) layer, wherein the AF layer is disposed between the first cobalt-ferrite layer and the ferromagnetic pinned layer.

* * * * *